(12) United States Patent
Jung et al.

(10) Patent No.: US 7,948,564 B2
(45) Date of Patent: May 24, 2011

(54) PROGRAMMABLE MASK AND METHOD OF FABRICATING BIOMOLECULE ARRAY USING THE SAME

(75) Inventors: Moon Youn Jung, Daejeon (KR); Dong Ho Shin, Daejeon (KR); Young Jun Kim, Daejeon (KR); Se Ho Park, Daejeon (KR); Hyeon Bong Pyo, Daejeon (KR); Chang Auck Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 413 days.

(21) Appl. No.: 12/213,244

(22) Filed: Jun. 17, 2008

(65) Prior Publication Data

US 2008/0273128 A1    Nov. 6, 2008

Related U.S. Application Data

(62) Division of application No. 11/100,544, filed on Apr. 7, 2005, now Pat. No. 7,403,236.

(30) Foreign Application Priority Data

Aug. 4, 2004  (KR) .................................. 2004-61275

(51) Int. Cl.
*G02F 1/1335* (2006.01)
(52) U.S. Cl. ........................................................ 349/4
(58) Field of Classification Search ............... 349/4, 130
See application file for complete search history.

(56) References Cited

U.S. PATENT DOCUMENTS

| | | | |
|---|---|---|---|
| 3,761,171 A * | 9/1973 | Fields | 399/137 |
| 4,201,453 A * | 5/1980 | Kobale et al. | 349/124 |
| 4,647,156 A | 3/1987 | Fujimura et al. | |
| 5,605,662 A | 2/1997 | Heller et al. | |
| 5,959,098 A | 9/1999 | Goldberg et al. | |
| 6,011,607 A | 1/2000 | Yamazaki et al. | |
| 6,093,302 A | 7/2000 | Montgomery | |
| 6,259,505 B1 | 7/2001 | Makino | |

(Continued)

FOREIGN PATENT DOCUMENTS

KR    2001-0002915    1/2001

(Continued)

OTHER PUBLICATIONS

Office Action dated Aug. 27, 2007 from the parent application.

(Continued)

*Primary Examiner* — James A Dudek
(74) *Attorney, Agent, or Firm* — Lowe Hauptman Ham & Berner LLP

(57) ABSTRACT

The present invention relates to a programmable mask used in a photolithography process for fabricating a biomolecule array and a method of fabricating a biomolecule array using the same and, more particularly, to a programmable mask which can increase a contrast ratio of transmittance versus shielding of light incident to a liquid crystal which constitutes each pixel by irradiating parallel ultraviolet ("UV") light generated from an external parallel light exposure device to a certain cell and using a vertically aligned liquid crystal panel or an LC panel having no spacer, and a method of fabricating a biomolecule array using the same.

16 Claims, 10 Drawing Sheets

U.S. PATENT DOCUMENTS

| | | |
|---|---|---|
| 6,271,957 B1 | 8/2001 | Quate et al. |
| 6,323,929 B1 | 11/2001 | Hirakata |
| 6,628,353 B2 | 9/2003 | Nakamura |
| 7,092,063 B2 | 8/2006 | Kim et al. |
| 2002/0149753 A1 | 10/2002 | Hase |

FOREIGN PATENT DOCUMENTS

| | | |
|---|---|---|
| KR | 1020030088773 | 11/2003 |

OTHER PUBLICATIONS

Office Action dated Oct. 1, 2007 from the parent application.
Notice of Allowance dated Mar. 18, 2008 from the parent application.
Emile F. Nuwaysir, et al.; "Gene Expression Analysis Using Oligonucleotide Arrays Produced by Maskless Photolithography"; Gnome Research (www.genome.org)' 12:1749-1755 © 2002 by Cold Spring Harbor Laboratory Press ISSN 1088-9051/02.

* cited by examiner (a)          (b)

(a)        (b)        (c)

(a)

(b)

PROGRAMMABLE MASK AND METHOD OF FABRICATING BIOMOLECULE ARRAY USING THE SAME

CROSS REFERENCE TO RELATED APPLICATION

This application is a divisional of U.S. Ser. No. 11/100,544, filed on Apr. 7, 2005 now U.S. Pat. No. 7,403,236. This application, in its entirety, is incorporated herein by reference.

BACKGROUND

1. Field of the Invention

The present invention relates to a programmable mask used in a photolithography process for fabricating a biomolecule array and a method of fabricating a biomolecule array using the same and, more particularly, to a programmable mask which can increase a contrast ratio of transmittance versus extinction of light incident to a liquid crystal which constitutes each pixel by irradiating parallel ultraviolet ("UV") light generated from an external parallel light exposure system to a certain pixel and using a vertically aligned liquid crystal panel or an LC panel having no spacer, and a method of fabricating a biomolecule array using the same.

2. Discussion of Related Art

A region comprised of one kind of biomolecule in a biomolecule array formed on a substrate is hereinafter referred to as a cell for convenience and clarity.

Researches on work for performing simultaneously various kinds of experiments using the biomolecule or polymer array have been heavily performed. The biomolecule array includes a polypeptides array, a nucleic acid (DNA, RNA) array, etc. One of the most important things for such a research is to effectively form a low-cost and high-purity array on a substrate.

A typical method of fabricating the biomolecule or polymer array includes a spotting method in which a micro robot moves three-dimensionally to selectively drop a biochemical material onto a desired location, a photolithography method which selectively irradiates light to a desired location to change a surface so that a coupling reaction between the surface and the biomolecule occurs at a certain location, and an electronic addressing method which adjusts electrode voltage of a microelectrode array such that a biomolecule is fixed only to a certain electrode.

The spotting method includes a contact printing method which stains with a solution as a marker is stamped on a paper, and a non-contact printing method which drops a solution. The contact printing method is performed in order of loading, printing and washing by an XYZ robot. Since a pin having a groove formed on its end like a point of a fountain pen is used, it is possible to control sample volume with reproducibility, and loading a sample once makes it possible to print several times. However, there is a disadvantage in that it is a limitation to increasing the number of arrays per unit area. The non-contacting printing method includes a dispensing method and an ink-jet printing method. The dispensing method is a method which drops a solution as in a micropipette, and the ink-jet printing method is a method which gives fine pressure to an ink reservoir to spout a solution out. The ink-jet printing can finely adjust a sample solution to a nano liter level, thereby increasing the number of arrays per unit area. However, since each sample solution needs the ink reservoir and the number of the ink reservoir to be mounted to the robot is limited, the ink-jet printing method can be used only in the case of fabricating an array using a small number of sample solutions.

The electronic addressing method is a method which fixes a biomolecule using a voltage control function of a microelectrode array, and includes a method which moves the biomolecule with an electric charge to an electrode surface to cause physical chemical coupling, and a method which fixes the biomolecule inside a thin film when the thin film is formed by electrochemical deposition (Consnier, "*Biomolecule immobilization on electrode surfaces by entrapment or attachment to electrochemically polymerized films. A view*" Biosensors & Bioelectronics 14: pp. 443-456 (1999)). For example, since a DNA has a strong negative charge, if an electrode has a positive charge, the DNA moves toward the electrode. At this time, if the physical chemical coupling is formed between the DNA and the electrode, the DNA is fixed to the electrode (U.S. Pat. No. 5,605,662). However, the electronic addressing method has problems in that it is more difficult to apply when the number of arrays is many, and it basically needs a microelectrode array. Besides, a method which electrochemically varies pH around the electrode to selectively fix a location of the biomolecule was developed. Using this concept, Combimatrix Corporation has suggested a method which location-selectively synthesizes an oligonucleotide to a microelectrode (U.S. Pat. No. 6,090,302, smith et al.). However, this method also has problems in that yield of each reaction is low and purity of each cell is low.

As a conventional method of fabricating a biomolecule array, a method using a liquid crystal display ("LCD") type programmable mask which can control transmittance of light instead of a photo mask and a micromachined mirror array has been suggested (U.S. Pat. No. 6,271,957, KR Patent No. 2001-0002915). However, all of the conventional methods described above just suggest only a concept using an LCD without any description on LCD requirement for patterning biomolecules, i.e., an LCD type to improve a contrast ratio which is most important in transmittance and extinction of light, and incident UV-light requirement, i.e., any statement that parallelism of incident light is important. Furthermore, U.S. Pat. No. 6,271,957 suggests only a simple concept without any statement that a spacer degrades improvement of contrast.

A biomolecule array is formed on a substrate by the photoreactions repeatedly caused by controlling light transmittance of each pixel of the LCD type programmable mask. It is ideal that a light extinction rate of a pixel which light should be shielded is close to zero (0). In this case, contrast will be infinite, and if such an LCD is employed, a programmable mask will be ideal, and an ideal DNA microarray will be fabricated.

However, since ideal contrast does not exist, a programmable mask which satisfies the followings is needed to get the maximum contrast ratio.

First, in order to increase the contrast ratio, parallel UV-light which is vertically irradiated to an LCD panel is needed. Second, in order to increase the contrast ratio, a liquid crystal should be aligned vertically. Third, in order to increase the contrast ratio, an LCD panel having no spacer should be used.

In order to form the biomolecule or polymer array as described above, an LCD type programmable mask which can resolve the above problems should be used.

SUMMARY OF THE INVENTION

The present invention is directed to a programmable mask which can increase a contrast ratio of transmittance versus extinction of light incident to a liquid crystal which constitutes each pixel by irradiating parallel UV-light generated from an external parallel light exposure device to a certain pixel and using a vertically aligned liquid crystal panel or an LC panel having no spacer.

The present invention is also directed to a method of fabricating a biomolecule array which can increase a contrast ratio using the programmable mask.

One aspect of the present invention is to provide a programmable mask including a liquid crystal (LC) panel between an upper substrate and a lower substrate to fabricate a DNA chip or a protein chip, wherein a liquid crystal which constitutes each pixel of the LC panel is vertically aligned and is driven in a vertical alignment mode, thereby improving a contrast ratio.

Another aspect of the present invention is to provide a method of fabricating a biomolecule array according to a pattern of the programmable mask.

BRIEF DESCRIPTION OF THE DRAWINGS

The above and other features of the present invention will be described in reference to certain exemplary embodiments thereof with reference to the attached drawings in which:

FIG. 5a shows a vertical alignment mode, FIG. 5b shows a parallel alignment mode, and FIG. 5c shows an oblique alignment mode;

FIG. 12a is a plan view illustrating the LC panel which has no spacer or which has a seal pattern, and FIG. 12b is an enlarged cross-sectional view taken along line A-A' of FIG. 12a.

DETAILED DESCRIPTION OF PREFERRED EMBODIMENTS

Figure 1A:
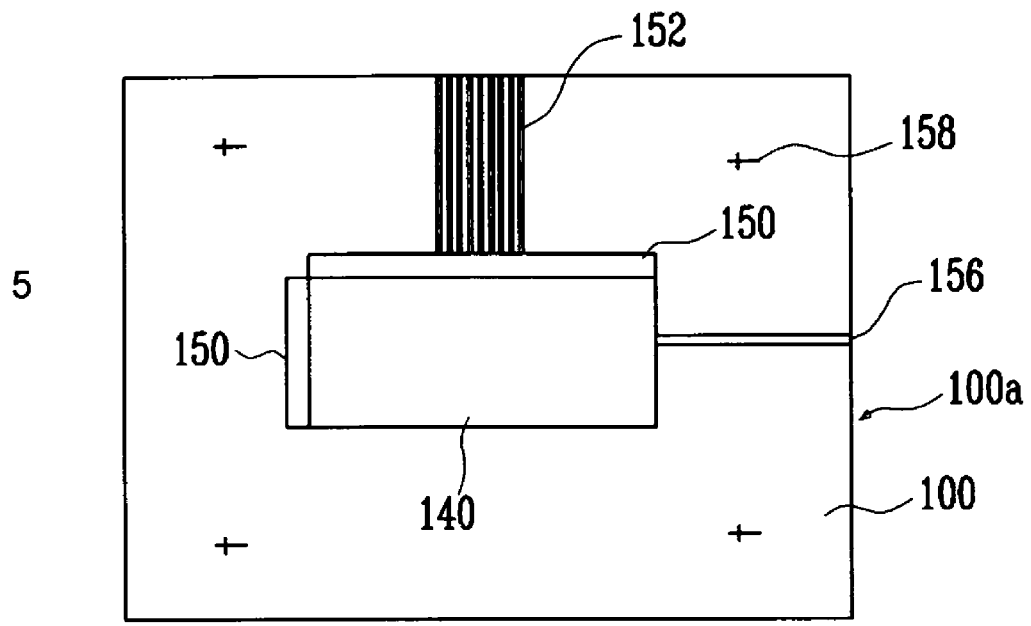
FIG. 1a is a plan view illustrating a thin film transistor liquid crystal display (TFT-LCD) type programmable mask according to an embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

Hereinafter, a structure of an LCD type programmable mask and a manufacturing method thereof for light switching of UV-light will be described in detail. Schematic configuration of the LCD type programmable mask will be explained with reference to the drawings, a circuit diagram and a cross-sectional view of the programmable mask and operation of a light valve liquid crystal will be explained, and reason that a vertically aligned liquid crystal and a parallelism of UV-light incident into a liquid crystal ("LC") panel are important will be explained.

Meanwhile, in order to synthesize a DNA micro array, it is better that the quantity of light transmitted is great if a liquid crystal of each pixel transmits light (a white state in the display) and that the quantity of leakage light transmitted is small if the liquid crystal of each pixel shields light (a black state in the display). A ratio of light quantity of the white state and the black state is referred to contrast, i.e., a contrast ratio.

In typical displays, the light quantity ratio of the white state and the black state in the entire pixels is referred to the contrast. However, in a DNA synthesis, yield of oligonucleotide synthesis formed in each pixel absolutely depends on the contrast ratio of each pixel, and the ratio of the white light and the black light in the unit pixel is important.

For example, in a DNA chip, an oligonucleotide is typically formed of coupling of 25 DNA bases. In respective spots on a DNA chip glass substrate corresponding to opening portions of a liquid crystal, DNA molecules are coupled according to a predetermined DNA sequence in sequencelling. Spots on the DNA chip corresponding to all pixels have different sequences from each other. The DNA is classified into four types of adenine (A), thymine (T), cytosine (C), and guanine (G). As an example of the synthesis, the adenine (A) is formed on a region of the DNA chip corresponding to a certain pixel. Then, the thymine (T) is synthesized on a region corresponding to another pixel. At this time, a region on which the adenine (A) is synthesized should be protected such that the thymine (T) does not be synthesized thereon. Of course, since the DNA bases stuck to the DNA chip have a protecting group, coupling does not occur before UV-light is irradiated thereto even though another base approaches thereto.

The adenine (A) of the certain pixel described above also has the protecting group, and so the coupling does not occur before the UV-light is irradiated thereto even though another base approaches thereto. Here, any UV-light should not reach the protecting group of the adenine (A) stuck to the certain pixel while the UV-light is irradiated to synthesize the thymine (T) to another pixel. Each spots on the DNA chip corresponding to each pixel has a predefined region, and many oligonucleotides exist in the region.

If a part of the UV-light is leaked in the liquid crystal of the certain pixel when pixel is off, parts of the oligonucleotides are changed to oligonucleotides having different DNA sequences from each other while the thymine (T) is coupled to the adenine (A) on some regions of the DNA chip corresponding to the pixel, thereby reducing synthesis yield. Since an ultraviolet beam which is identical to or larger than the area of an LC panel is irradiated, the LC pixel which desires to shield UV-light should perfectly shield the UV-light.

Figure 1B:
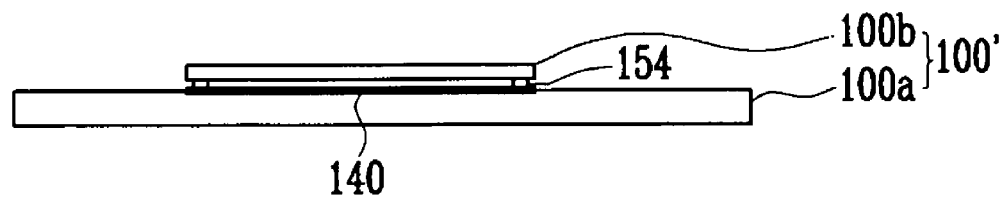
FIG. 1b is a front view illustrating the TFT-LCD type programmable mask of FIG. 1.

FIG. 1a is a plan view illustrating a thin film transistor liquid crystal display (TFT-LCD) type programmable mask according to an embodiment of the present invention. FIG. 1b is a front view illustrating the TFT-LCD type programmable mask of FIG. 1.

Referring to FIGS. 1a and 1b, a quartz substrate 100 having excellent transmittance of UV-light has a rectangular shape like a photo mask, and a TFT-LCD type light valve region, i.e., a UV-light irradiatable region 140 comprised of an active matrix polysilicon TFT array and a liquid crystal is formed on a portion of the substrate 100. A driving IC region 150 is located on two sides of the UV-light irradiatable region 140 and formed on the same plane as the active matrix TFT array. The driving IC applies an electrical signal to a gate line and a data line of each of TFTs arranged in a matrix form, and selects a pixel to be switched (i.e., applies a gate signal and a source signal to a TFT of a pixel to be selected). An electrode pad 152 is arranged to connect the driving IC to an external IC. Flexible printed circuit ("FPC") bonding is performed for the electrode pad 152.

In the periphery of the programmable mask quartz substrate 100 having the polysilicon TFT array, four alignment keys 158 are arranged. The quartz substrate 100 having such a structure is referred to a lower substrate 100a. When the lower substrate 100a including the polysilicon TFT array, the driving IC, and the electrode pad 152, etc. is formed on the quartz substrate 100, an upper substrate 100b on which an upper transparent electrode pattern (not shown) is formed corresponding to each pixel of the lower substrate 100a is fabricated as an opposite substrate to inject a liquid crystal.

As a mask body, the lower substrate 100a has a sufficient thickness to endure bending which may occur due to external force. Preferably, the lower substrate 100a has a thickness of 2 to 5 mm in the case of a large-sized LC panel of more than five (5) inches and a thickness of 300 to 600 μm in the case of less than five (5) inches. The upper substrate 100b has a thickness which can minimize possible absorption of UV-light and preferably has a thickness of 0.1 mm to 0.6 mm. In order for the liquid crystal to keep a constant thickness, a bonding portion 154 is formed between the lower substrate 100a and the upper substrate 100b, and the liquid crystal is injected through a liquid crystal injection port 156 between the lower and upper substrates 100a and 100b and then sealed. As described above, the programmable mask 100' is fabricated by attaching the upper and upper substrates 100a and 100b to each other and sealing it. In FIGS. 1a and 1b, polarizer films are not shown for convenience.

Figure 2:
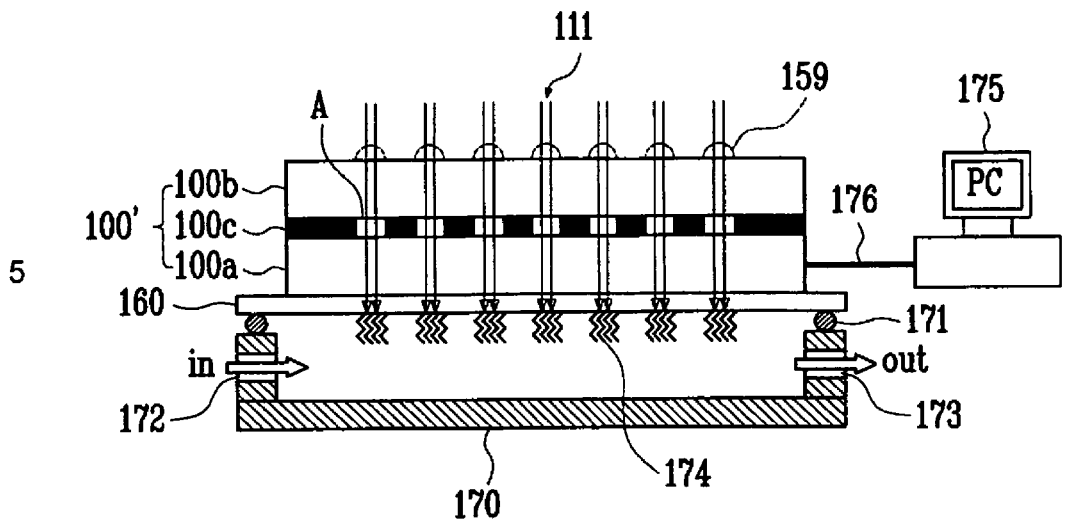
FIG. 2 is a schematic view illustrating a photolithography process using a TFT-LCD type programmable mask according to an embodiment of the present invention.

FIG. 2 is a schematic view illustrating a photolithography process using a TFT-LCD type programmable mask according to an embodiment of the present invention. FIG. 2 is a schematic view showing that UV-light 111 generated from a parallel light exposure device (see 600 of FIG. 11) is vertically irradiated to an LC panel 100c of the programmable mask 100' so that the UV-light transmitting a selected region synthesizes an oligonucleotide 174, i.e., forms a DNA synthesis pattern on a bottom surface of a glass substrate 160 arranged on a flow cell 170.

Referring to FIG. 2, a liquid crystal programmable mask having a lower substrate 100a and an upper substrate 100b, which are attached to each other, with an LC panel 100c interposed therebetween is used.

A bottom surface of the glass substrate 160 which is formed on the flow cell 170 and made of a material which has high transmittance in a wavelength of 340 to 370 nm serves as a cover of the flow cell 170 and is a surface on which a DNA is synthesized and so the oligonucleotide 174 is formed. An O-ring 171 is installed between the glass substrate 160 and the flow cell 170 to prevent leakage of a fluid, and an inlet 172 and a drain outlet 173 of the fluid are formed on one side and the other side of the flow cell 170, respectively. Here, dA, dT, dG, dT, $CH_3CN$ which is a solvent, and deprotecting solutions are filled in the flow cell 170 through the inlet 172.

A liquid crystal pixel is performed such that programmed data is outputted from a personal computer ("PC") 175 through a connection portion 176 to operate a desired TFT on a TFT array, and a selected TFT switches a liquid crystal valve. The DNA synthesis pattern of FIG. 2, i.e., the oligonucleotide 174 is a pattern of a DNA molecule, and a protein array which is synthesized by repeatedly irradiating the UV-light 111.

At an upper portion of the LC panel 100c corresponding to a liquid crystal portion "A" which constitute each pixel, a microlens 159 may be arranged to collect the UV-light 111 incident toward the liquid crystal portion A. If the UV-light 111 irradiated to the microlens 159 passes through the LC panel 100c and the glass substrate 160 and is collected on a bottom surface of the glass substrate 160 at an appropriate angle to have a predetermined area, the oligonucleotide 174 is synthesized on the bottom surface of the glass substrate 160. At this time, the synthesis area can be controlled by a curvature radius of the microlens 159.

Figure 3:
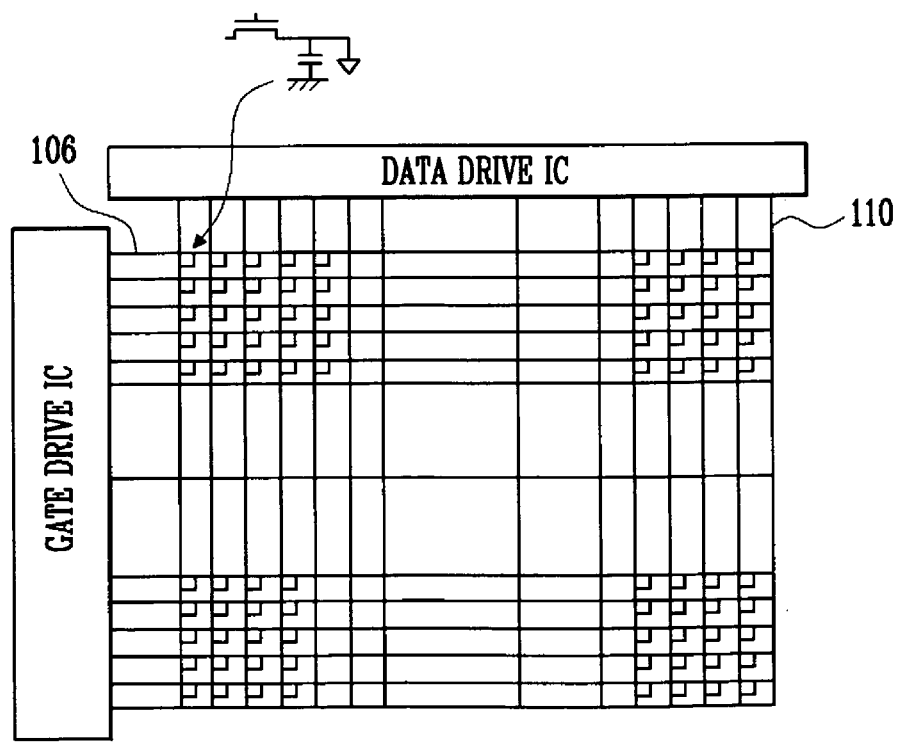
FIG. 3 is a circuit diagram illustrating a driving IC-integrated active matrix programmable mask according to an embodiment of the present invention.

FIG. 3 is a circuit diagram illustrating a driving IC-integrated active matrix programmable mask according to an embodiment of the present invention.

Referring to FIG. 3, a feature of the inventive programmable mask is an integrated driving IC and a polysilicon TFT arranged on a pixel region because synthesizing a high density DNA is an object. As shown in FIG. 3, a high density array can be formed by arranging an integrated driving IC having a polysilicon TFT in a peripheral region of the pixel region.

The driving IC-integrated active matrix programmable mask has an advantage in that high density can be achieved by reducing a pixel size. The programmable mask of the present invention employs a polysilicon TFT in a pixel and has an integrated driving IC formed on a peripheral region of the pixel region at the same time as the pixel.

In order to directly connect a gate line 106 and a data line 110 to a circuit, an active layer of a TFT is formed of polysilicon and the pixel region and the driving IC region are located on the same plane. For the sake of stable driving of a liquid crystal, a storage electrode having a relatively large area is formed to maximize capacitance of a storage electrode, which is a feature of a commercial TFT-LCD.

Figure 4:
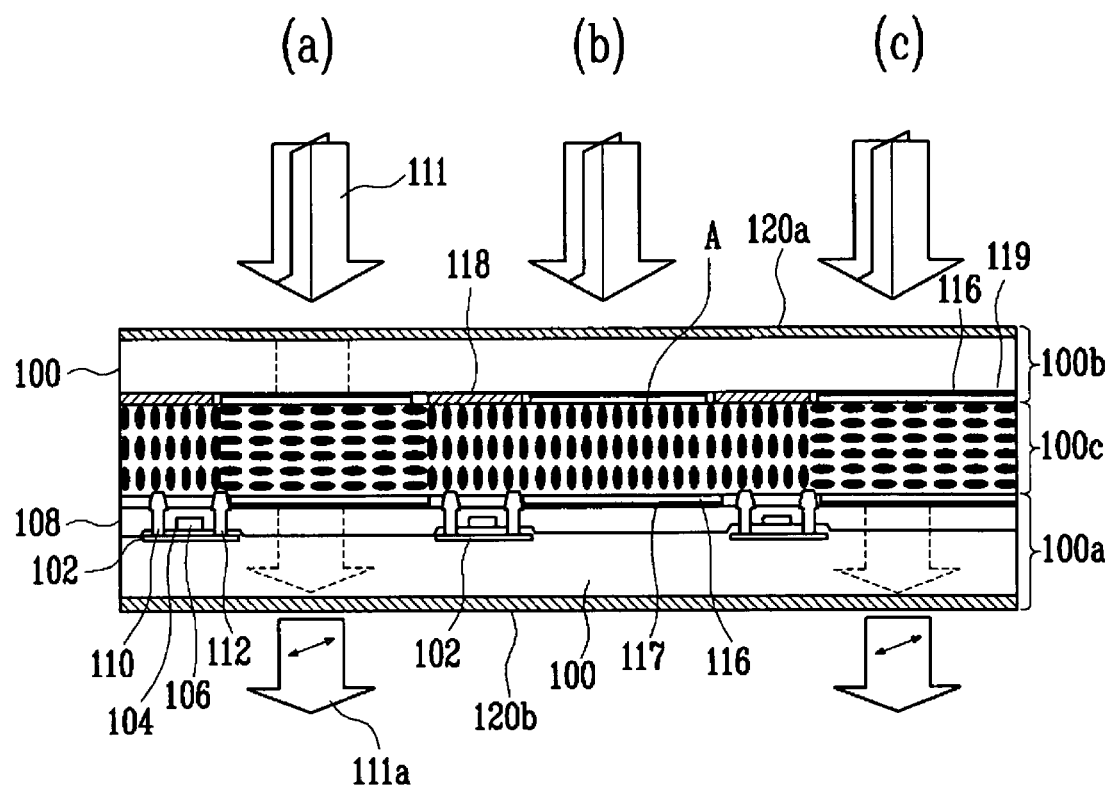
FIG. 4 is a cross-sectional view illustrating a driving IC-integrated active matrix programmable mask according to an embodiment of the present invention.

FIG. 4 is a cross-sectional view illustrating a driving IC-integrated active matrix programmable mask according to an embodiment of the present invention.

A fabricating process of the driving IC-integrated active matrix programmable mask is explained below with reference to FIG. 4. A polysilicon thin film 102 is formed on a quartz substrate 100 having a thickness of 2-5 mm using an excimer laser annealing technique or a furnace annealing technique. A gate insulating layer 104 is formed on the polysilicon thin film 102 using a plasma enhanced chemical vapor deposition ("PECVD") technique. The gate insulating layer 104 may also be formed of a high temperature oxide layer. A gate electrode 106 is formed of a doped polysilicon or metal electrode. An interlayer insulating layer 108 is deposited, and source and drain electrodes 110 and 112 are formed. Then a lower pixel electrode 117 is formed to be connected to the drain electrode 112. The lower pixel electrode 117 is made of a transparent material such as indium tin oxide ("ITO").

In order to help alignment of the liquid crystal, a vertical alignment film 116 using a vertical alignment liquid crystal mode is formed. Therefore, the lower substrate 100a is completed.

A fabricating process of the upper substrate 100b is explained below.

A light shielding layer 118 is formed on a quartz substrate 100 having a thickness of 100 to 600 μm to shield UV-light 111 irradiated to a TFT, and a passivation layer (not shown) is formed. Thereafter, an upper pixel electrode 119 and a vertical alignment film 116 are formed. The upper pixel electrode 119 is made of a transparent electrode to which a common voltage is applied.

The upper substrate 100b and the lower substrate 100a are attached to each other according to a process order of a typical TFT-LCD. Then, a polarizer film 120a and a polarizer film 120b are attached respectively to the upper and lower substrates 100b and 100a.

In FIG. 4, (b) represents a normally black state that a ground voltage of zero volts is applied to both upper and lower sides of the vertically aligned liquid crystal and the incident UV-light 111 is shielded at the LC portion A of the LC panel 100c. In (a) and (c) of FIG. 4, a voltage is applied to both sides of the vertically aligned liquid crystal, and the liquid crystal transmitted UV-light 111. The transmitted UV-light is linearly polarized light and is denoted by an arrow 111a.

As the polarizer films 120a and 120b, a metal grating polarizer film or a polymer film for UV-light which has transmittance and reliability the UV-light 111 having a wavelength of 330 to 400 nm are used. The metal grating polarizer film is preferably such that thin film lines which are made of a metal having high reflectance such as aluminum or gold and have a constant line width are arranged in a certain direction. A line width and a line interval depend on a wavelength of UV-light.

The two metal grating polarizer films are installed on top and bottom surfaces of the LC panel 110c. Each of the metal grating polarizer films is excellent in transmittance compared to an organic polymer polarizer film, and so can reduce the UV-light exposure time to synthesize one DNA base. In the case of the oligonucleotide synthesis, synthesis of 25 bases generally requires total 100 times of light exposures, thereby reduction of time required to synthesize one base significantly contributes to reduction of time required to synthesize all bases.

An inorganic crystal may be used to get polarization. A representative organic polymer includes a polyvinyl alcohol ("PVA"), and the inorganic crystal includes calcite, quartz, tourmaline, sodium nitrate, rutile, $TiO_2$, etc. Also, a Gran-Thompson calcite polarizer film made of the inorganic crystal may be used.

The vertical alignment film 116 is made of a material which is excellent in transmittance to the UV-light having a wavelength of 330 to 400 nm and is not transformed by the UV-light.

Preferably, the vertical alignment film 116 is formed of a silicon oxide layer formed by a inclined sputtering technique or a inclined thermal evaporation technique and having reliability to the UV-light, or formed of a diamond-like-carbon ("DLC") layer that a liquid crystal has a vertical alignment effect by irradiating an ion beam.

The inclined thermal evaporation technique uses an inorganic material such as SiO or $SiO_2$. A representative method of forming such an inorganic alignment film includes a inclined evaporation method in which an inorganic material such as oxide is deposited at a predetermined inclined angle to the substrate. Typically, SiO is used as a deposition material. An alignment state of liquid crystal molecules depends on a deposition condition such as a deposition angle, a deposition speed, a vacuum degree, and a film thickness, or a deposition material, and a liquid crystal material.

Figure 5A:
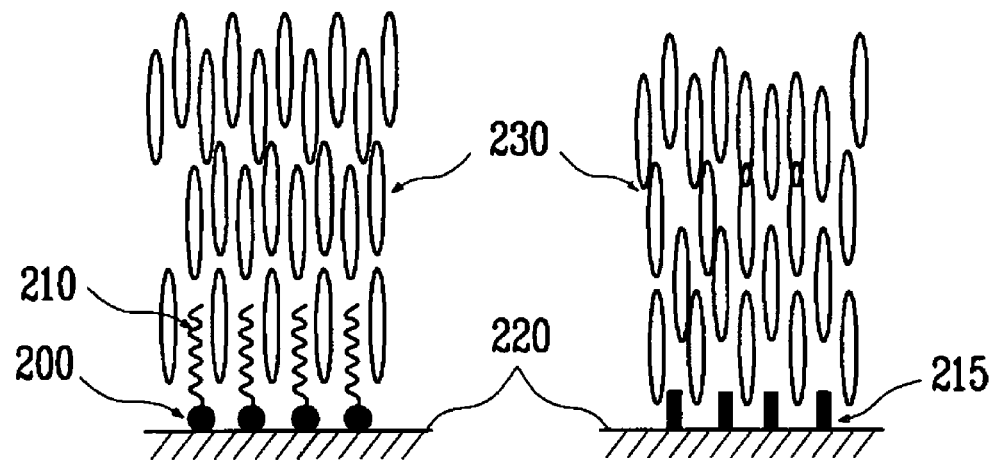
FIGS. 5a to 5c are views illustrating various alignment modes of a liquid crystal.
Figure 5B:
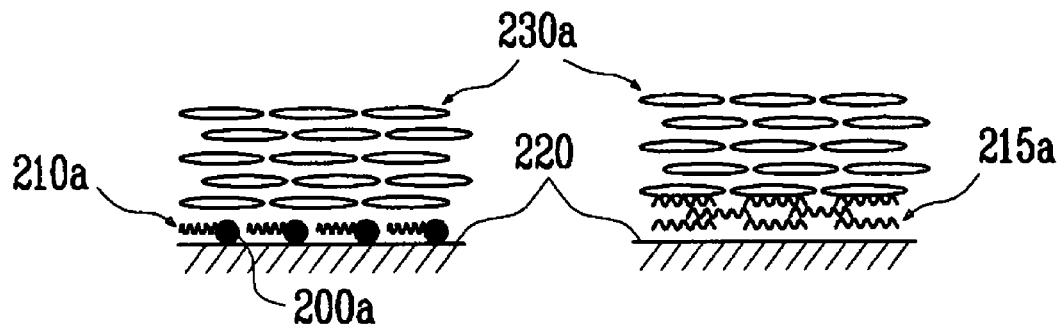
Figure 5C:
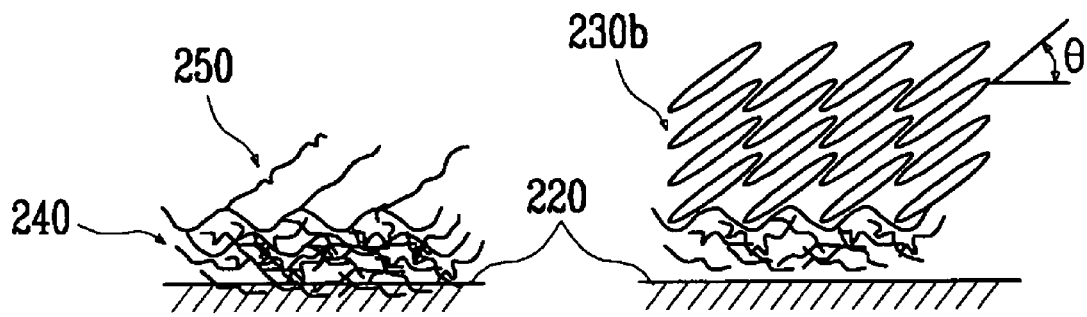

FIGS. 5a to 5c are views illustrating various alignment modes of a liquid crystal. FIG. 5a shows a vertical alignment mode, FIG. 5b shows a parallel alignment mode, and FIG. 5c shows an oblique alignment mode.

Referring to FIG. 5a, in the vertical alignment mode having a high contrast ratio, initial orientation of the liquid crystal is a vertical direction. That is, if a liquid crystal 230 is aligned on a surface of a glass substrate 220 after a surface coupling agent 210 is coupled to silane or polar group 200, the liquid crystal 230 is vertically aligned as shown in FIG. 5a. Also, an inorganic material such as SiO 215 may be deposited to vertically align the liquid crystal 230.

The vertically aligned liquid crystal 230 is in a normally black state which shields light in the state that a voltage is not applied. Quantity of leakage light in this state is a fourth of a twisted nematic ("TN") alignment mode. For example, if the contrast ratio of the TN alignment mode is 400:1, when driving the liquid crystal using the vertical alignment mode, a contrast ratio of 1600:1 can be obtained.

Referring to FIG. 5b, if a liquid crystal is injected in a parallel direction to a surface of the glass substrate 220 after the surface coupling agent 210a is coupled to the silane or polar group 200a as a typical parallel alignment mode, the liquid crystal 230a operates in a parallel alignment mode. Also, a polymer 215a may be used to align in parallel the liquid crystal 230a.

Referring to FIG. 5c, a tilt alignment mode is shown. The glass substrate 200 is surface-treated so that a major axis of the liquid crystal is aligned at a predetermined inclined angle, i.e., a pretilt angle θ to the glass substrate 200. That is, in an alignment film comprised of a main chain 240 and a side chain 250, the liquid crystal 230b is aligned to have a predetermined angle θ along the side chain 250.

Figure 6:
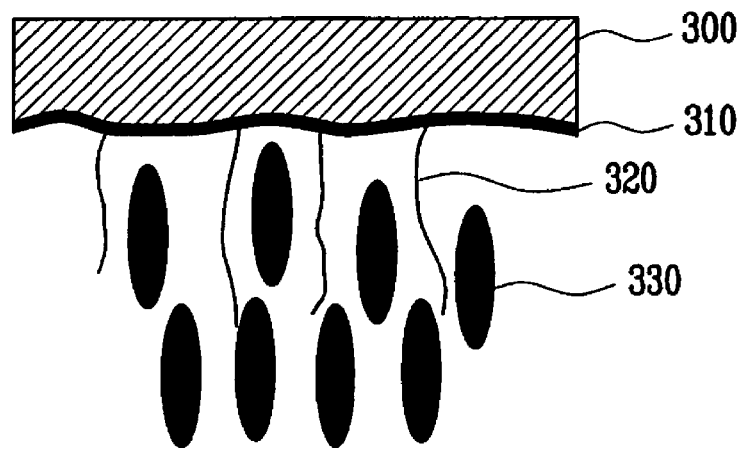
FIG. 6 is a detailed view illustrating a vertical alignment film using a vertical alignment mode according to an embodiment of the present invention.

FIG. 6 is a detailed view illustrating a vertical alignment film using a vertical alignment mode according to an embodiment of the present invention.

Referring to FIG. 6, a vertical alignment mode using a polymer is shown. A polyimide main chain 310 is formed on a glass substrate 300, and an alkyl side chain 320 is formed, thereby forming a vertical alignment film. Thereafter, if a liquid crystal 330 is injected on the resultant structure, the liquid crystal 330 is vertically aligned.

Figure 7:
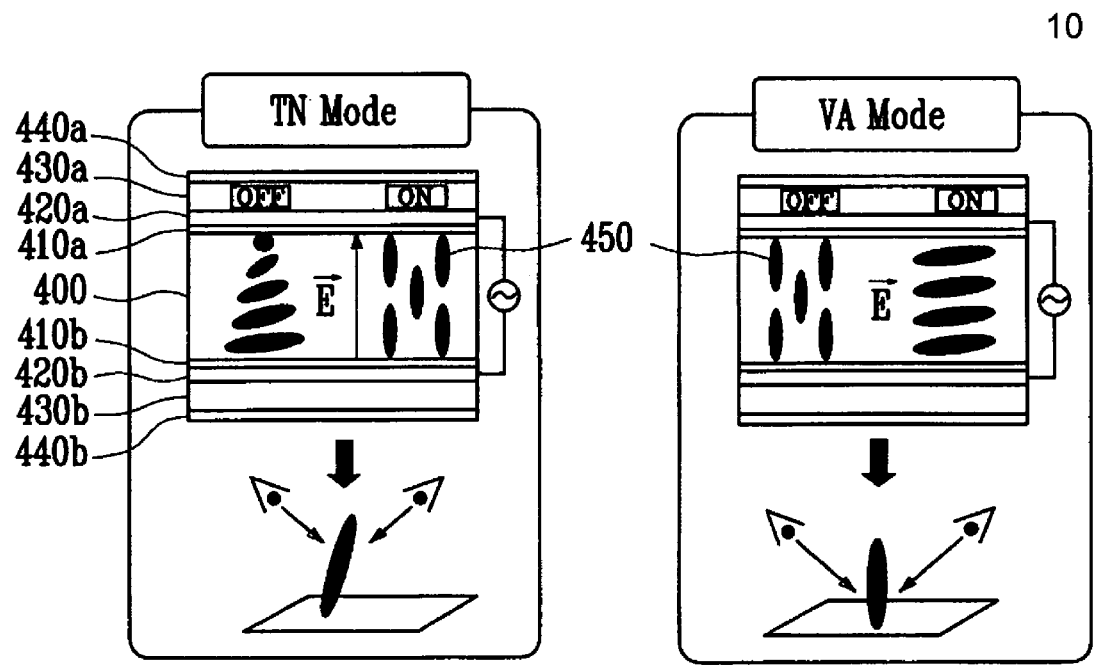
FIG. 7 is a detailed view illustrating a driving state of a TN (twist nematic) alignment mode and a vertical alignment mode.

FIG. 7 is a detailed view illustrating a driving state of a TN alignment mode and a vertical alignment mode.

Referring to FIG. 7, as components of the TN alignment mode, TN mode alignment films 410a and 410b, transparent electrodes 420a and 420b, upper and lower substrates 430a and 430b, and upper and lower polarizer films 440a and 440b are sequentially arranged on top and bottom surfaces of an LC panel 400, respectively.

In the TN alignment mode, if it is in an OFF state, linearly polarized light incident to the top surface of the LC panel 400 reaches the lower polarizer film 440b while rotating at 90° along a direction of the twisted liquid crystal. At this time, the linearly polarized light is shielded by the lower polarizer film 440b which is arranged to be perpendicular to the upper polarizer film 440a. If it is in an ON state, liquid crystal molecules 450 stand up in a major axis direction thereof, and so the linearly polarized light is transmitted. Here, reference symbol "E" denotes that an electric field is applied such that a voltage is applied to both sides of the LC panel 400.

As components of the vertical alignment mode, vertical alignment films 410c and 410d, transparent electrodes 420a and 420b, upper and lower substrates 430a and 430b, and upper and lower polarizer films 440a and 440b are sequentially arranged on top and bottom surfaces of the LC panel 400, respectively.

In the vertical alignment mode, if it goes to an ON state from a normally black state, a major axis direction of the liquid crystal 450 lies down so that the linearly polarized light is transmitted. The vertical alignment mode has four times the contrast ratio of the TN alignment mode.

Figure 8:
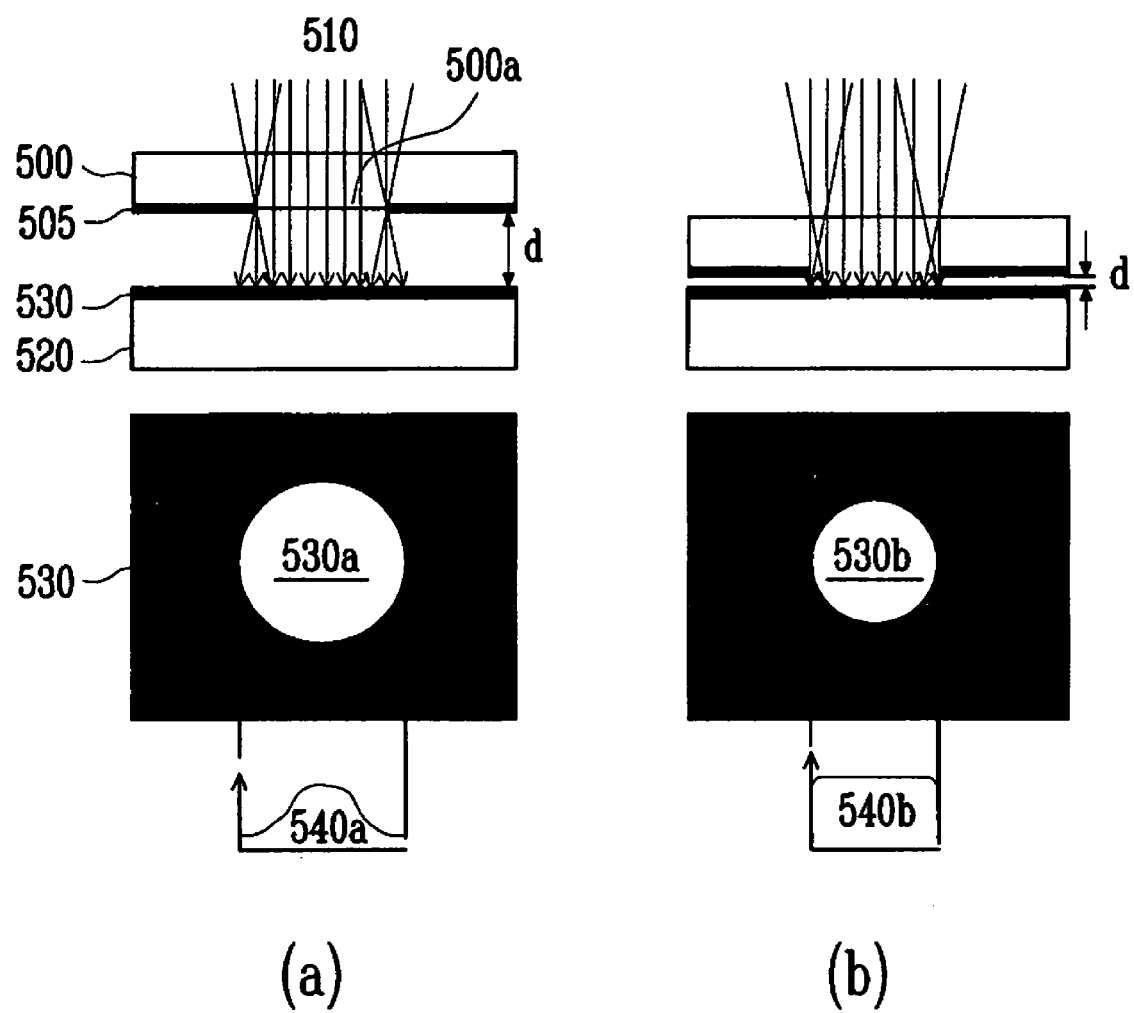
FIGS. 8a and 8b are views illustrating a exposure pattern and UV-light intensity distribution of a photoresist according to a separating distance in non-parallel incident light.

FIGS. 8a and 8b are views illustrating a exposure pattern of a photoresist and UV-light intensity distribution according to a separating distance in non-parallel incident light. Let us assume that a mask pattern 500a has a circular shape for the sake of convenience of a description.

Referring to FIGS. 8a and 8b, in using a contact aligner used in a semiconductor exposure process, a photo mask 500, UV-light 510, and a positive photoresist 530 coated on a substrate 520 are prepared In particular, the UV-light 510 of the contact aligner is a light source which is not good in parallelism, and the exposure process is performed at a predetermined separating distance, i.e., proximity "d" from a chromium pattern 505 of the photo mask 500.

In this case, the contact aligner can make the separating distance d zero (0) to perform the exposure process, but the reason of mentioning the separating distance d is because a thickness of the glass substrate (see 160 of FIG. 2) on which a DNA array is formed and which is a cover of the flow cell (see 170 of FIG. 2) through which a fluid needed for DNA synthesis flows should be considered in the DNA synthesis device. That is, the separating distance d is necessarily important because the oligonucleotide is formed below the glass substrate 160. To reduce the separating distance d, the glass substrate 160 having a very small thickness should be used, but there is a limit to reducing the thickness of the glass substrate 160 due to mechanical strength.

Such a limit depends on the size of the glass substrate 160 which covers the flow cell 170 and is in a range of tens to hundreds of microns. For the foregoing reasons, in the contact aligner, the separating distance d should be considered.

As shown in FIG. 8a, in the contact aligner, if the size of the mask pattern 500a is small (several μm to 50 μm), the separating distance d is 100 μm to hundreds of μm, and the UV-light 510 is not parallel light, a photoresist 530 on the substrate 520 is difficult to get a vivid pattern. That is, because non-parallel light particles are incident to the photo mask 500 and the mask pattern 500a in a inclined direction and at the same time are transmitted in an incident direction at the separating distance d, a larger exposure pattern 530a than an original mask pattern 500a is formed.

Also, there is a disadvantage in that uniformity 540a of the UV-light intensity on the pattern as well as increase of the size is bad. Actually, the DNA synthesis may occur in the non-uniform manner on the whole area of the flow cell 170.

As shown in FIG. 8b, an exposure pattern after the exposure process is performed in a contact state that the separating distance d is zero (0) is shown. Even though the UV-light 510 is non-parallel light, in the sate that the photo mask 500 and the photoresist 530 are in contact with each other, an exposure pattern 530b of the same size as the original mask pattern 500a is formed, and the uniformity 540b of the UV-light intensity is also excellent in the regions except an pattern edge.

However, in the practical DNA synthesis device, the thickness of the glass substrate 160 which is a cover of the flow cell 170 and a substrate of a DNA chip can not be zero (0), that is, it is difficult to reduce the thickness of the glass substrate to be less than a predetermined thickness. Therefore, the assumption of FIG. 8b does not occur. For this reason, parallel light should be used in the flow cell 170.

Figure 9:
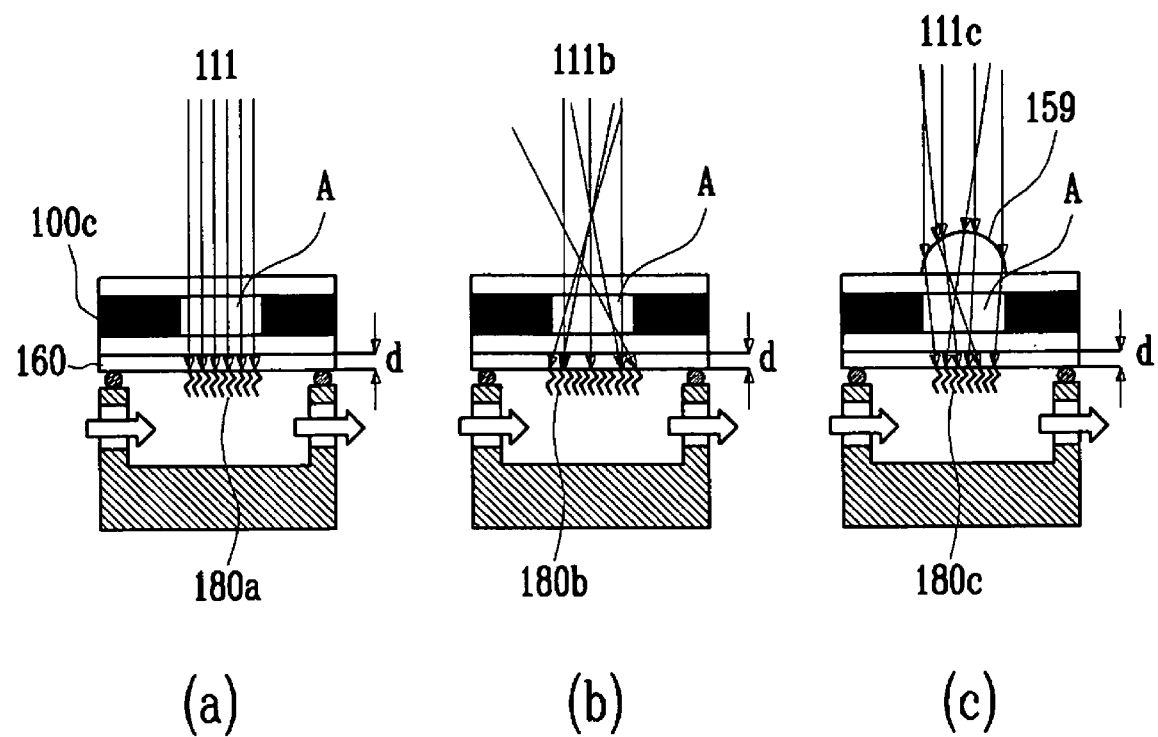
FIGS. 9a to 9c are schematic views illustrating a state of a DNA synthesis pattern when parallel UV-light and non-parallel UV-light are irradiated into a programmable mask according to an embodiment of the present invention.

FIGS. 9a to 9c are schematic views illustrating the state of a DNA synthesis pattern when parallel UV-light and non-parallel UV-light are irradiated to a programmable mask according to an embodiment of the present invention.

Referring to FIG. 9a, since the thickness of the glass substrate 160 for DNA synthesis, i.e., the separating distance d exists, light particles of the UV-light 111 outputted from a parallel light exposure device (see 600 of FIG. 11) have parallel characteristics to each other and are irradiated vertically to the liquid crystal portion A of the LC panel 100c, and thus an excellent DNA synthesis pattern 180a can be obtained.

Referring to FIG. 9b, in the state that the parallel light exposure device 600 of the present invention is not used, since non-parallel UV-light 111b is irradiated to the liquid crystal portion A of the LC panel 100c, a DNA synthesis pattern 180b has non-uniform DNA density, and the DNA synthesis pattern 180b has a different shape from an opening portion of the liquid crystal portion A.

Referring to FIG. 9c, a microlens 159 is attached to a top surface of the upper substrate 100b corresponding to the liquid crystal portion A of the LC panel 100c to collect the incident UV-light 111c to have a predetermined area below the glass substrate 160 above the flow cell 170 through the opening portion of the liquid crystal portion A. Even though the incident UV-light 111c is not perfect parallel light, an excellent DNA synthesis pattern 180c can be obtained.

Figure 10:
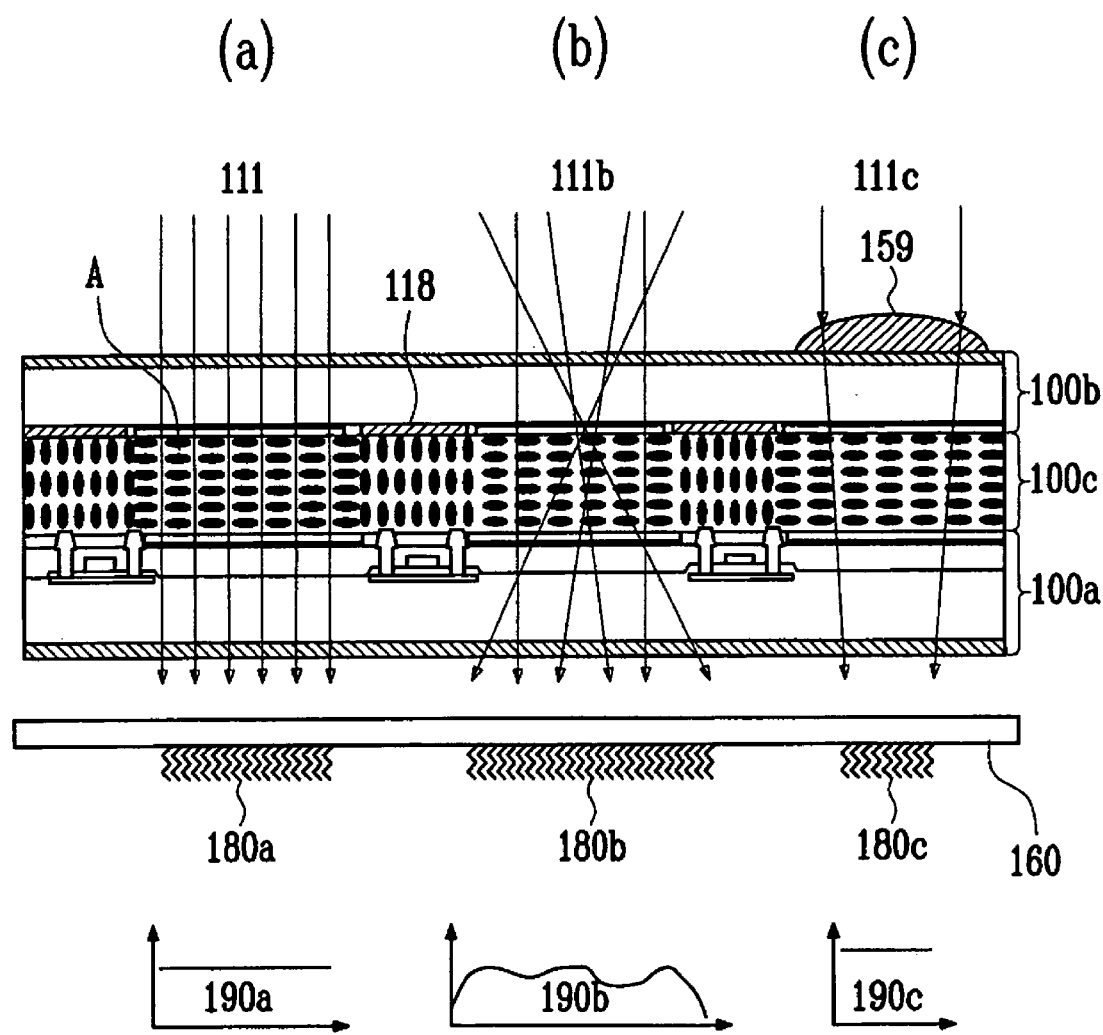
FIGS. 10a to 10c are detailed views illustrating a state of a DNA synthesis pattern and distribution of UV-light intensity when parallel UV-light and non-parallel UV-light are irradiated into a programmable mask according to an embodiment of the present invention.

FIGS. 10a to 10c are detailed views illustrating the state of a DNA synthesis pattern and distribution of UV-light intensity when parallel UV-light and non-parallel UV-light are irradiated to a programmable mask according to an embodiment of the present invention.

Referring to FIG. 10a, when parallel UV-light 111 generated from the parallel light exposure device (see 600 of FIG. 11) of the present invention is irradiated to the liquid crystal portion A of the LC panel 100c, an excellent DNA synthesis pattern 180a of the same size as the liquid crystal portion A can be obtained below the glass substrate 160 above the flow cell (see 170 of FIG. 2), and uniformity 190a of the UV-light intensity is also excellent.

Referring to FIG. 10b, in the state that the parallel light exposure device 600 of the present invention is not used, when non-parallel UV-light 111b is irradiated to the liquid crystal portion A of the LC panel 100c, a DNA synthesis pattern 180b larger than the liquid crystal portion A can be obtained below the glass substrate 160 above the flow cell 170, and uniformity 190b of the UV-light intensity is also bad.

Referring to FIG. 10c, the microlens 159 is attached to a top surface of the upper substrate 100b corresponding to the liquid crystal portion A of the LC panel 100c to collect the incident UV-light 111c to have a predetermined area below the glass substrate 160 above the flow cell (see 170 of FIG. 2) through the opening portion of the liquid crystal portion A. Even though the incident UV-light 111c is not perfect parallel light, an excellent DNA synthesis pattern 180c can be obtained, and uniformity 190c of the UV-light intensity is also excellent.

As described above, a DNA synthesis pattern formed on the glass substrate 160 for DNA synthesis arranged above the flow cell 170 greatly depends on a feature of the incident UV-light.

Figure 11:
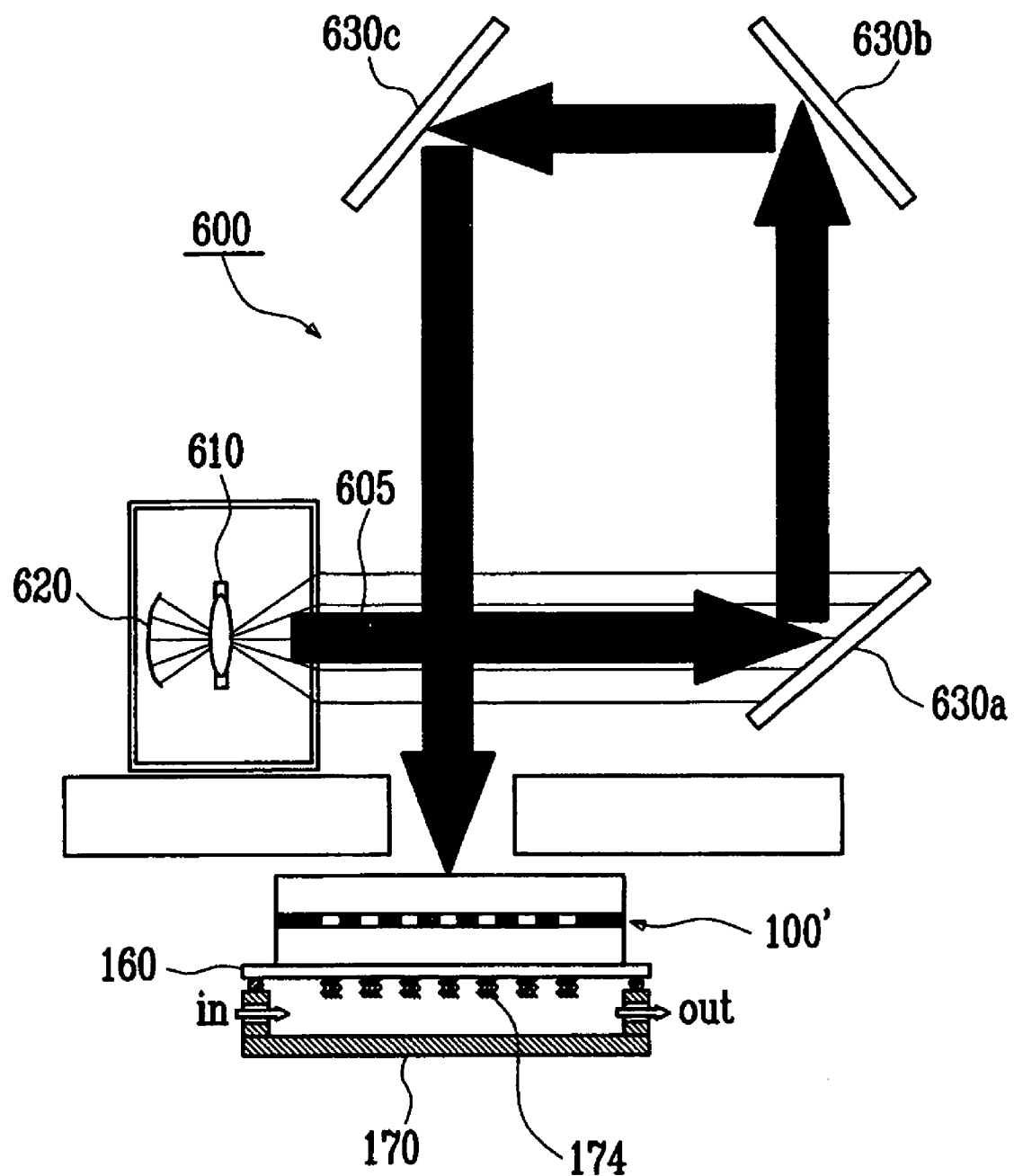
FIG. 11 is a configuration view illustrating a parallel light exposure device according to an embodiment of the present invention.

FIG. 11 is a configuration view illustrating a parallel light exposure device according to an embodiment of the present invention.

Referring to FIG. 11, the parallel light exposure device 600 includes a light source 610 (e.g., a mercury lamp having a wavelength of 365 nm) for generating UV-light 605 having a predetermined wavelength, a reflecting mirror 620 arranged at one side of the light source 610 to collect the UV-light generated from one side of the light source 610 and emanate it to the other side, and a plurality of UV-light reflectors 630a to 630c for vertically reflecting the UV-light 605 generated from the light source 610 to remove non-parallel light.

Here, as a distance between the light source 610 and the UV-light reflector 630a is large, as a distance between the UV-light reflectors 630a to 630c is large, or as the number of the UV-light reflectors is many, parallelism is higher.

Meanwhile, as a device of obtaining the parallelism of the incident light, an embodiment of the present invention has suggested the parallel light exposure device 600 of FIG. 11, but the present invention is not limited to this, and all parallel light exposure devices coupled to the liquid crystal programmable mask may be included. As an example, a parallel light source generated from an ultraviolet accelerator may be used as incident light of the liquid crystal programmable mask, and a laser light source having a plurality of reflectors may be incident light.

Figure 12:
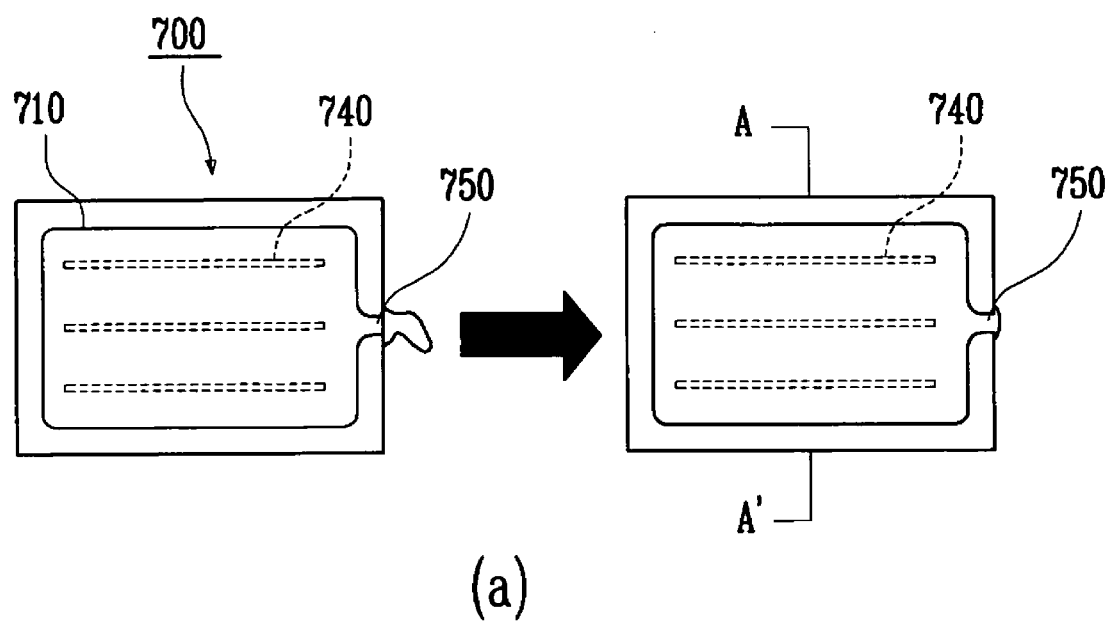
FIGS. 12a and 12b are views illustrating an LC panel which has no spacer or which has a seal pattern according to another embodiment of the present invention.
Figure 12:
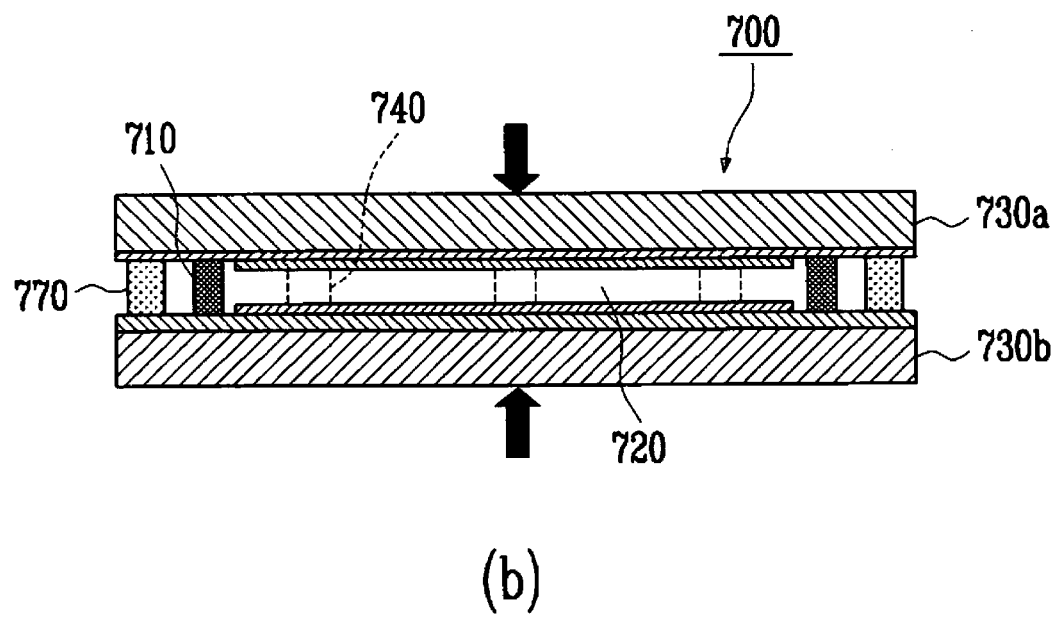

FIGS. 12a and 12b are views illustrating an LC panel which has no spacer or which has a seal pattern according to another embodiment of the present invention. FIG. 12a is a plan view illustrating the LC panel which has no spacer or which has a seal pattern, and FIG. 12b is an enlarged cross-sectional view taken along line A-A' in FIG. 12a.

Referring to FIGS. 12a and 12b, in the case of a small-sized LC panel 700 of less than 13 inches in the diagonal length, upper and lower glass substrates 730a and 730b can maintain a mechanical strength enough to maintain a cell gap 720 at the central portion of the LC panel 700 with only an LC panel seal 710 formed on the periphery of the LC panel 700.

However, in the case that a large-sized LC panel is used as a liquid crystal mask for DNA synthesis, the mechanical strength is weak due to droop of the upper and lower substrates 730a and 730b so that it is difficult to maintain the cell gap 720. Therefore, in order to maintain the cell gap 720 without holding up the central portion of the large-sized LC panel using a conventional spacer (not shown), seal patterns 740 with spacers are formed in several places as many as not to disturb injection of a liquid crystal.

Here, a DNA synthesis pattern is not formed at liquid crystal portions where the seal pattern 740 is formed. That is, since, in the DNA photosynthesis, oligonucleotides of different sequences corresponding to respective pixel portions are formed, LC pixels corresponding to the seal pattern 740 are not used. The large-sized LC panel has a large number of pixels, and thus even though pixels corresponding to the seal patterns 740 remain as a dead space, it does not greatly affect the formation of the whole sequence of the DNA.

In typical display devices, the spacers are used to control the cell gap 720 between the opposite upper and lower substrates 730a and 730b to uniformly maintain the thickness of a liquid crystal layer. The spacers are distributed in the spherical particle form in the liquid crystal to maintain the cell gap 720 between the upper and lower substrates 730a and 730b of the LC panel. In operation of the liquid crystal, movement of the liquid crystal around the spacer particles is locally disturbed by the spacer particles.

Therefore, if the movement of the liquid crystal is disturbed by the spacers at a moment of shielding light, a small quantity of light leaks through the liquid crystal, thereby degrading the contrast ratio. Therefore, in the present invention, an LC panel is used which maintains the cell gap without using the spacers. Reference numerals 750 and 770 denote a liquid crystal injection port and a blocking wall, respectively.

The preferred embodiments of the present invention as to the programmable mask and the method of fabricating a biomolecule array using the same have descried above, but the present invention is not limited to this and can be embodied in various forms in scope of detailed description of the present invention and attached drawings.

As described herein before, according to the present invention, the programmable mask and the method of fabricating the biomolecule array using the same have advantages in that by irradiating parallel UV-light from the external parallel light exposure device to a certain cell and using the vertical aligned LC panel or the LC panel having no spacer, the contrast ratio of transmittance versus shielding of light of a liquid crystal which constitutes each pixel can be increased, and a high density oligonucleotide array can be formed based on the high contrast ratio, whereby it is very convenient to biotechnology engineers and pharmaceutical researcher who use a DNA chip or protein chip.

What is claimed is:

1. A programmable mask, the mask comprising:
    an upper substrate;
    a lower substrate;
    a liquid crystal panel positioned between the upper substrate and the lower substrate, a liquid crystal of the liquid crystal panel being vertically aligned and configured to be driven in a vertical alignment mode; and
    a parallel light exposure device, the device comprising:
        a light source arranged to emit UV-light having a predetermined wavelength;
        a first reflector positioned within the light path and configured to reflect the UV-light received from the light source;
        at least one intermediate reflector positioned within the light path and configured to reflect the UV-light received from the first reflector; and
        a second reflector positioned within a light path and configured to reflect the UV-light received from the intermediate reflector to the upper substrate,
        wherein predetermined distances between the first, the intermediate, and the second reflectors are configured to eliminate non-parallel light.

2. The programmable mask of claim 1, wherein the vertical alignment is formed of a silicon oxide layer having reliability to ultraviolet light or a diamond-like-carbon ("DLC") layer.

3. The programmable mask of claim 1, wherein the liquid crystal constitutes each pixel of the liquid crystal panel, the liquid crystal being configured to receive parallel and homogeneous ultraviolet light.

4. The programmable mask of claim 1, further comprising a microlens installed on a top surface of the liquid crystal panel corresponding to a liquid crystal portion which constitutes a pixel of the liquid crystal panel, wherein the microlens is configured to collect the ultraviolet light incident to the liquid crystal portion.

5. A method of fabricating a biomolecule array according to a pattern of a programmable mask using the programmable mask of claim 1.

6. The programmable mask of claim 1, further comprising a reflecting mirror positioned at one side of the light source to reflect the UV-light to another side of the light source along the light path.

7. The programmable mask of claim 1, further comprising two polarizer films, one among the two polarizer films being installed on top surface of the liquid crystal panel, and the other among the two polarizer films being installed on bottom surface of the liquid crystal panel.

8. The programmable mask of claim 1, wherein as components of the vertical alignment mode, vertical alignment films, transparent electrodes, the upper and lower substrates, and upper and lower polarizer films are sequentially arranged on top and bottom surfaces of the liquid crystal panel.

9. The programmable mask of claim 1, further comprising a gate insulating layer positioned beneath the lower substrate.

10. The programmable mask of claim 9, further comprising more than one gate electrodes positioned within the gate insulating layer, each one of the gate electrodes having a source electrode and a drain electrode.

11. The programmable mask of claim 10, further comprising more than one light shielding layers positioned on the upper surface of the liquid crystal panel and positioned to vertically shield each of the gate electrodes.

12. The programmable mask of claim 10, further comprising more than one lower pixel electrodes positioned between the gate electrodes and each one of the pixel electrodes connecting to the corresponding drain electrode.

13. The programmable mask of claim 12, further comprising more than one upper pixel electrodes positioned on the upper surface of the liquid crystal panel and each corresponding to the position of one of the lower pixel electrodes.

14. A method of fabricating a biomolecule array according to a pattern of a programmable mask using the programmable mask comprising:
  an upper substrate;
  a lower substrate;
  a liquid crystal panel positioned between the upper substrate and the lower substrate, one or more liquid crystals of the liquid crystal panel being vertically aligned and configured to be driven in a vertical alignment mode; and
a parallel light exposure device comprising:
  a light source arranged to emit UV-light having a predetermined wavelength;
  a first reflector positioned within the light path and configured to reflect the UV-light received from the light source;
  at least one intermediate reflector positioned within the light path and configured to reflect the UV-light received from the first reflector; and
  a second reflector positioned within a light path and configured to reflect the UV-light received from the intermediate reflector to the upper substrate,
  wherein predetermined distances between the first, the intermediate, and the second reflectors are configured to eliminate non-parallel light, the method comprising:
selecting at least one of the liquid crystals of the liquid crystal panel, the selected liquid crystal constituting a pixel to be switched; and
vertically and repeatedly irradiating UV-light via the liquid crystal panel to a composition to synthesize the biomolecule array from the composition, the composition comprising:
  source materials having a protecting group; and
  a deprotecting solution.

15. The method of claim 14, wherein the irradiating comprises irradiating the composition comprising the source materials, the source materials including DNA bases.

16. The method of claim 14, wherein the irradiating comprises:
  shielding the composition from the UV-light, responsive to a ground voltage applied to both an upper and a lower side of the vertically aligned liquid crystal, or
  allowing transmission of the UV-light, responsive to a voltage applied to the upper and the lower side of the vertically aligned liquid crystal.

* * * * *